(12) United States Patent
Brown

(10) Patent No.: US 6,768,100 B1
(45) Date of Patent: Jul. 27, 2004

(54) CONTINUOUS POSITION CALIBRATION FOR SERVO CONTROLLED ROTARY SYSTEM

(75) Inventor: David C. Brown, Northborough, MA (US)

(73) Assignee: GSI Lumonics Corporation, Nashua, NH (US)

( * ) Notice: Subject to any disclaimer, the term of this patent is extended or adjusted under 35 U.S.C. 154(b) by 72 days.

(21) Appl. No.: 10/057,168

(22) Filed: Oct. 29, 2001

Related U.S. Application Data

(60) Provisional application No. 60/244,115, filed on Oct. 27, 2000.

(51) Int. Cl.[7] ................................................ G01D 5/34
(52) U.S. Cl. ................................... 250/231.13; 250/230
(58) Field of Search ....................... 250/231.13–231.19, 250/230; 356/614–622

(56) References Cited

U.S. PATENT DOCUMENTS

| | | |
|---|---|---|
| 4,044,248 A | 8/1977 | Glassman |
| 4,070,111 A | 1/1978 | Harrick |
| 4,941,082 A | 7/1990 | Pailthorp et al. |
| 5,425,013 A | 6/1995 | Fennema et al. |
| 6,243,190 B1 * | 6/2001 | Koguchi ..................... 359/226 |

* cited by examiner

Primary Examiner—Thanh X. Luu
(74) Attorney, Agent, or Firm—Maine & Asmus

(57) ABSTRACT

A continuous optical calibration system for a galvanometer scanner. The system maintains one or more fiducial position references in each axis, independent of the normal position detector circuit. An optical reference position monitor circuit triggers a calibration signal when load position coincides with a reference position, whereupon the measured position of the position detector and then current look up table is compared to the known reference position, and an error correction is generated and applied to the look up table. The optical monitor circuit includes a rotor rigidly attached to the load shaft so as to rotate between a light emitter and detector. A thin slit in the rotor permits passage of a highly collimated light beam to the detector only when the slit is aligned between the emitter and detector, which occurs only when the load is at or passing through the reference position.

22 Claims, 4 Drawing Sheets

CONTINUOUS POSITION CALIBRATION FOR SERVO CONTROLLED ROTARY SYSTEM

This application relates and claims priority to pending U.S. patent application Ser. No. 60/244,115, filed Oct. 27, 2000.

TECHNICAL FIELD OF THE INVENTION

The present invention relates to positional calibration of servo-motor driven systems; and more particularly to an integral, continuous calibration system of the position sensor circuit of a galvanometer.

BACKGROUND OF THE INVENTION

Galvanometer scanners are often used, either singly or in multiples, to point a light beam with high resolution, linearity, and repeatability. As an illustrative example of a demanding application, a pair of galvanometers arranged in Cartesian coordinates cooperate to point a laser beam over a solid angle of 30 degrees to a precision of 1 micro-radian or less anywhere in that field of view. The accomplishment of this task requires that the system be carefully calibrated in advance, to remove all the geometrical errors in mounting of the parts, and correct all of the residual non-linearity in the position detectors used to provide the feedback error signals to the servo system.

This calibrating is often done by commanding a series of positions in the field of view, recording the actual positions achieved, measuring the actual positions, and generating a set of correction factors by desired field position which are then combined with the command signal in such a way that the final position corresponds to the intended command. This set of correction factors is often stored in a look-up table. Such a table is constructed with rows and columns of cells, each representing a solid angle position. In each cell is stored one or a pair of correction values to be utilized when a measured position coincides with the cell's field position.

Due to the complexity of the overall system of which the galvanometer scanners are but a part, and because the task for which the system is designed is usually a repetitive production task, such as drilling 1000 via holes per second in pre-wired boards or printed circuit boards, it is desirable for operating cost considerations that the system, once calibrated, operate continuously around the clock for extended periods without the need for periodic time consuming maintenance or adjustment.

Since a two dimensional, 30 degree solid angle field of view contains approximately $2.5 \times 10^{11}$ resolvable points, the calibration process is complex and very time consuming. The calibration is more accurate when a larger number of points are utilized, but the increased number of points equates to more time and expense. Although by necessity carried out with the aid of high-speed data processing equipment, the calibration process usually takes several hours to complete. The calibration process is lengthy and tedious, but provides an accurate means of ensuring that the actual position is the same as the commanded position—at least as of the time the angular position was calibrated. For angles between the calibrated points simple interpolation is used.

Unfortunately, the galvanometer scanners are inherently incapable of maintaining the linearity and precision of their position detectors over long periods of time. Nor are they immune entirely to the influences of change in temperature and relative humidity in their operating environment. As a result, the galvanometer or galvanometers begin to drift away from their calibrated condition immediately after calibration, and eventually again produce errors in pointing that offends the limits of accuracy required of their operation. Because of the high-speed production of parts that is the purpose of the system, it is often the case that a considerable quantity of scrap has been produced before the out of tolerance condition is detected.

A number of calibration techniques have been used in the past to re-establish the angular relationship to account for the drifts. One such method, termed in-field fiducials, uses detectors positioned in the field of view with special locations defined by X and Y coordinates. The differences are translated into factors that are stored in the machine circuitry and used to recalibrate the system from time to time. Others use a sample product every hour to define error values by physical measurement, and plot the deterioration of performance. It is also possible to employ fences as thresholds to determine when to recalibrate.

But, in a production run on a system with a capital cost that may approach one million dollars, stopping production in order to calibrate a relatively cheap component is not cost-effective or desired. The production machines need to run continuously, day and night for seven days per week, in order to be efficient.

As stated, there are a number of ways to recalibrate the system. The in-field fiducials are not part of a galvanometer head but are part of the overall machine. The in-field fiducials are targets, light detectors that signal when illuminated. About once a minute the system makes a measurement of the target sensors. There is processing required to compute the error amount, which requires some computational time as well as computer resources. Direct position error of load is achieved by this method.

Although in-field fiducials can be designed and manufactured as part of a new system, it is very difficult to upgrade or convert an existing system after the fact, because of the high degree of precision in positioning the target sensors remotely from the galvanometer head. Even if the targets/fiducials are placed inside the galvanometer head and look at the back of mirrors, an alternate configuration that has been tried, this is an intermediate step and still requires stopping and running a separate procedure and taking processing time to compute the calibration factors. Finally, all this does is calibrate the load with respect to the head.

Besides the calibration to resolve individual galvanometer characteristics, there are latency issues. The latency issues arise because the acceleration and maximum speed of galvanometers are limited. For example, the time to go from point A to point B is a time T. But, the time to go from point A to point 2B, is not 2T. It is necessary to calibrate these motions so the time intervals of a large number of points are measured and interpolation is used for points in-between the measured points.

For illustrative purposes, suppose a command signal versus time, such as a step function position command that lasts for some arbitrary time, is injected into a galvanometer scanner system. The signal has infinite slope, which only occurs in ideal and not practical agreements. Because of inertia, the system can not respond instantly—it accelerates as the command is applied. There is some latency because it takes time for the system to detect the command and the magnitude level. At some future time the position of the load sensor reaches the desired position.

In general, because of inertia—similar to a mass spring system—the system acts as a tortional spring on each end of the shaft with respect to the motor. The ideal situation seeks to minimize latency and settling, and the stiffer the system the more ideal the system performance.

The calibration or recalibration process is typically done by calibrating the galvanometer before or during a pause in the manufacturing process. It is necessary to build the head and set up the system to perform a point by point array in the field of view. An average sequence may start with 64 points consisting of corners and middle points, measuring these points by the various methods known in the art. The field of view may consist of $10^6$ points, so when a particular point is commanded it is necessary to interpolate from the look-up table to obtain the corrected position. The number of resolvable points are much greater than the calibrated number of points and it is therefore necessary to interpolate from the look-up table to obtain the best fit gain and offset.

Gain and offset are the two components or factors that control where in the box or field of view the command is pointing. From initial calibration measurements, initial calibration data is converted into gain and offset components. A look-up table is generated in order to correct the commanded point from the point that was actually measured to the intended point, by providing the gain and offset correction to be added to the position directly measured by the position sensor for each axis. This type of system performs adequately in ideal operating conditions, but nonideal conditions significantly impact the position. In particular, temperature changes influence the performance of the galvanometer and skew the gain and offset values so that the calibrated position is no longer accurate. Temperature effects are continuous and discontinuous, and significantly effect galvanometer performance.

The errors generally accrue over time, while the system is operating, leading to inaccuracies that eventually become intolerable if not corrected. An error in system gain can be described as a change in distance along either or both axis between the actual positions and the positions as measured from the same two calibration position commands when repeated at a later time. If the two positions are initially characterized as having a particular value on each axis, an error in gain is proportional to the change in the sum of these values. An error in offset will be apparent as a change in the position of one or both actual positions resulting from a later repeat of the respective initial calibration position commands.

Based on testing, the general trajectory of the temperature effects is a drift at about a 45 degree angle, this angle suggesting a substantially equal amount of drift in each of two similar galvanometers of a two-dimensional scanner. But, the effects are discontinuous, having sudden motions where the effects of the gain and offset may actually reverse direction. Continued operation of the galvanometers has a rather large distribution of errors in position that is difficult to predict or calibrate. These errors cannot be tolerated for those operations that require a high threshold of accuracy.

In summary, galvanometer recalibration is a necessity, and the only remedy to date has been to stop production and re-calibrate. The cost of the scrap, the cost of down-time of production machinery, and the cost of re-calibration are significant factors for this kind of manufacturing. The designers of galvanometers have been searching for a way or ways to minimize both the frequency of re-calibration required and the amount of scrap produced before the need for re-calibration has been discovered.

SUMMARY OF THE INVENTION

Accordingly, it is an object of the present invention to provide a non-contact means of continuously re-calibrating a galvanometer while in use.

Another object is to provide for continuous optical recalibration of the full range position sensor circuit and lookup table of a galvanometer, by using optical sensors illuminated through collimating slits in a calibration rotor closely coupled to the load so as to indicate at all times during the operation of the galvanometer the precise moments when the load is present at one or more known, unvarying fiducial positions within its normal angular range, and comparing the known fiducial position to the concurrently reported position from the position sensor circuit and lookup table, then calculating errors in the reported position and providing updates to the lookup table so as to regain the initial calibration accuracy.

Yet another object of the invention is to provide a two axis scanning device with a non-contact, continuous calibration capability in each axis that functions without interruption to the ongoing operation of the scanning device.

Still another object is to provide a dual axis electronic module that controls two specially constructed galvanometers using inter-module command, position, and temperature control interfaces. Each galvanometer has a full range capacitive position detector (PD) and an optical reference system. It is well known in the art that the PD exhibits error over time due to mechanical and thermal conditions. The present invention utilizes an optical reference that is stable over time to recalibrate the galvanometer without stopping the system and without undue complexity of processing resources and time.

One of the fundamental concepts of the invention is to compare the instantaneous value of the corrected position feedback signal with a known reference or fiducial position value that represents the value that the feedback signal had when it was initially calibrated. Any difference between the current PD signal and the calibrated reference PD signal represents a PD error. Any PD error is noticed immediately and an appropriate change to the value in that cell of the look-up table can be generated. As a result, the drift of the galvanometer in each axis, at a pre-selected one or more values on the respective axis within its normal range of motion, is continuously monitored and corrected each time it reaches the pre-selected value, so that the PD subsystem never goes out of calibration unless the system drifts out of the range of error correction capability.

The assumption behind the algorithm of the present invention is that the reference signal is perfect—and since this process takes place on the fly, that the position feedback signal is sampled at exactly the moment that the reference angular position is represented by the calibrated value from the look-up table. In practice, assuring that these conditions are met is extremely difficult and represents one aspect of the inventive subject matter of the present invention.

In theory, the system would stop at an exact location and allow a measurement of that exact location. However, this is not practical. First, no mechanical system of hard reference stops is practical because the degree of precision required is a fraction of a micron. Even if a sufficiently stiff structure could be constructed, wear on the contacting parts would quickly render the stops unreliable in angular position.

In addition, the process of finding these stops, which must of necessity be outside the operating range of the galvanometer, requires that the production process be stopped periodically so that the stops can be located. And, the time required for this type of calibration is the sort of costly cessation of production that the invention is intended to eliminate.

Of the non-contact methods known, capacitive sensors are themselves notorious for instability. Magnetic sensors of the Hall effect type are both unstable and susceptible to the magnetic fields generated inside the galvanometer during its operation. However, optical sensors are readily available which are both stable over long periods of time, and relatively insensitive to magnetic fields, temperature, and humidity changes.

In general, systems incorporating PD are adequate if the calibration of the angular relations of the position sensor and the load is quantified and maintained. But, as alluded in the background section, in the real world, as the system ages and as temperature changes, the angular relationship between the position sensor and the load changes. The changes brought on by mechanical and thermal conditions are well known in the art and the necessity to recalibrate and reestablish the angular relationship may be conducted once a day or once or an hour depending on the desired accuracy.

It is therefore a further object of the invention to provide a galvanometer calibration system where this inherent drift is self-correcting. The continuous, on-the-fly recalibration process produces a correction value that is applied directly to the look up table cells to re-calibrate the original values. Furthermore, the accuracy provided by the invention is maintained over long periods of operating time until the limits of the recalibration technique are reached and no longer can bring the system into conformity.

A yet further object is to perform correction on the fly and in real time, continuously during operation of the galvanometer. A still further object is to hold results for trend analysis and defer corrections until needed so no operating time is used up in the correction. A still yet further object permits altering of the reference angle or offset at which a calibration position is applied.

An additional object is to provide for correcting gain and offset, as well as for customizing limits of tolerance and changing limits on the fly.

Another additional object is to provide a means of alerting and signaling when an out of tolerance calibration condition arises. As is well known in the art, re-calibration prolongs the production life, but eventually the errors will require a more formal maintenance and mechanical adjustments to bring the system back into a working region. Such signaling means includes audible and visual alerts to bring attention to the production line to limit the amount of scrap produced.

One of the purposes of the present invention is to provide retrofits for existing systems to take advantage of the benefits of the present invention without purchasing an entirely new system.

The present invention significantly reduces the overall distribution of the position errors. A purpose of the system is to get from the initiation of a command to an adequately settled position of load in minimum time. The position of the load is what really matters, not the various sensors. But the sensors are needed to ensure the commanded position of the load equals the actual position of the load.

One goal of the invention is to provide for adding a new position sensor to the galvanometer shaft. This may be accomplished by putting an extension on the shaft and adding a low mass calibration reference rotor with two radially oriented reference position slits displaced around the rotor. The rotor is preferably proximate the load on the shaft, so that the reference rotor and load are rigidly interlocked, rotationally speaking. While the calibration sensor does not have much dynamic range, and may be configured for only two values in the arc or range of load rotation, it is extremely precise at these locations and uses all dynamic range within the two slits representing the two calibration points. The system may be designed to be extremely rigid and mechanically stable, and made insensitive to temperature variations as, for example, by using temperature insensitive materials such as invar.

It is yet another goal of the invention to have two galvanometers cooperatively configured at right angles to provide X and Y movement control of a light beam over a two dimension target area. Two calibration reference positions are selected on each axis of the target area, one on each side of the center or home position within the field of view, the values of which are defined after an initial calibration of the load angle with respect to fiducial positions in the target area.

Selecting just two positions with respect to the range of rotation of each galvanometer, which equates to two positions on each axis of motion on the target area, reduces processing resources and the time needed for processing when the positions are used for the calibration process of the invention. However, other schemes employing one or more positions for each axis of motion may be implemented by and are within the scope of the invention. Various embodiments of the invention also reduce hysterisis in the system and differentiate between gain and offset.

One of the principles of the present invention is a stable, load-locked reference system integral to the galvanometer that is used as a true position reference of the load. Any difference between the true position reference whenever it occurs, and the concurrently reported position by the full range position sensor and lookup table or equivalent initial calibration data, is interpreted as an error of the position sensor. Two rotational positions for each galvanometer, which equate to two values on each axis of motion in the target area, are employed to enable separation of gain from offset and to apply two multiplicative corrections to the interpolated look-up table command, thus providing corrections in both X and Y axis in a two dimensional scanning system.

With respect to the target area of a two galvanometer, two dimension system, the aspect of the invention for calibrating the position detector output may be explained as consisting of a smaller or inner view calibration frame or fence within the full field of view of the target area. For example, with a square target area with center 0,0. for each axis put two reference fiducials in the field of view, the four reference fiducials defining the inner view frame size and location. Although the percentages are not critical, offsets of the frame sides may be selected as 80% and 20% from center for each of the X and Y axis. The offset inner view frame is sized and located so that any movement of the system away from the home or center position, is likely to cross one side or another of the inner view frame.

At the moment of crossing a fiducial fence, or side of the position reference frame, the system takes a snapshot of the measured position indicated by the full range position sensor, as the direct measurement corrected by initial calibration data from the lookup table or however else applied. It then compares the pre-determined reference position of the respective fence to the full range position sensor's measured value on the associated axis, and calculates and applies the required error correction to the correction lookup table or equivalent mechanism. All this occurs while the system is working on the fly, and does not impede productivity. This eliminates downtime from re-calibrations and extends time between system calibration.

Still other objects and advantages of the present invention will become readily apparent to those skilled in this art from the following detailed description, wherein only a preferred embodiment of the invention is described, simply by way of illustration of the best mode contemplated for carrying out the invention. As will be realized, the invention is capable of other and different embodiments, and its several details are capable of modifications in various obvious respects, all without departing from the invent on.

BRIEF DESCRIPTION OF THE DRAWINGS

The present invention will be readily understood by the following detailed description in conjunction with the accompanying drawings, wherein like reference numerals designate like structural elements, and in which.

DESCRIPTION OF THE PREFERRED EMBODIMENT

To those skilled in the art, the invention admits of many variations. The following is a description of a preferred embodiment, offered as illustrative of the invention but not restrictive of the scope of the invention. Among the embodiments of invention there is a method and system for "on the fly" calibration of a galvanometer using optical detection of angular rotation to or through a predetermined point or points within the normal range of angular motion or system view of view. The novel aspects of the invention will be discussed in terms of the preferred embodiment and other examples within the scope of the invention.

Figure 1:
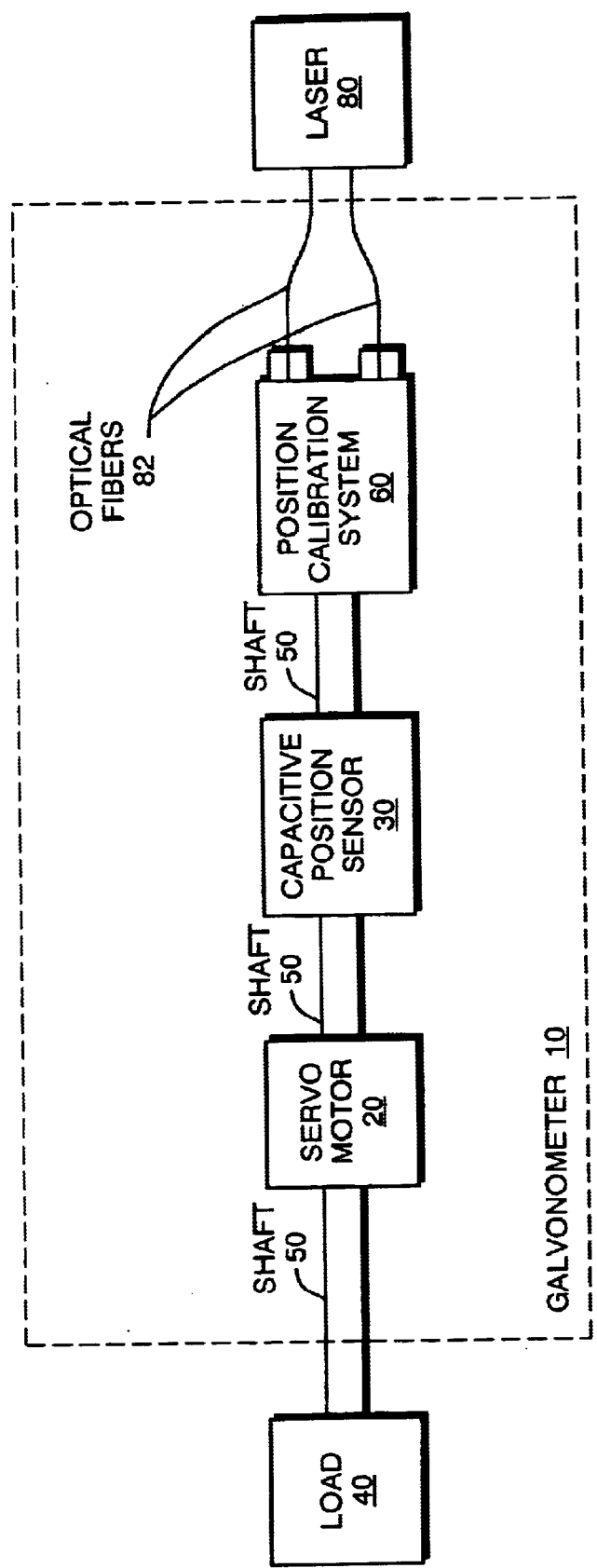
FIG. 1 is a block diagram of a galvanometer with an integral optical position calibration system with an external illumination source, mounted outboard of the full range position sensor.

Referring to FIG. 1. there is a block diagram illustration of a galvanometer 10, including a servo motor 20 and capacitive full range position sensor 30, connected to load 40 by a common shaft 50. The angular range is limited to less than one revolution, typically to less than 40 degrees.

Other types of full range position detectors are equally applicable. As was discussed previously, the usual manner of system implementation includes an initial calibration of actual system output position caused by repositioning of load 40, to the position sensor output. This calibration exercise generates a set of corrections which are stored in a lookup table for all or a range of points in the effective range of motion of the system.

To this extent, galvanometer 10 is typical of the prior art. Such devices are commonly used in pairs such as, for example, in a two axis scanning device that projects a light beam onto a planar, two dimensional target, and by command signals to the two galvanometers, can direct the light beam to any point within the target area or field of view to within the resolution and accuracy provided by the scanner system.

However, galvanometer 10 departs from the prior art by addition of optical, position calibration system 60 outboard of full range position sensor 30. The occurrence of an optical calibration signal from system 60 indicates that load 40 is at a pre-determined reference position. The concurrent reported position from the full range position sensor 30 is the direct measurement of the position sensor as corrected by any initial calibration data resident in the look-up table.

Any difference between the reference position and the reported position represents an error that is applied as a correction to the look-up table data. This recurring calibration maintains the initial precision of the scanner for an extended period of time.

Common shaft 50 mechanically links load 40 and capacitive full range position sensor 30 to the rotating component of calibration system 60. In this embodiment, the calibration system employs an external or remote laser light source 80, and optical fibers 82 to pipe light to the optical calibration system. In other embodiments there may be provided internally mounted laser diodes or other light emitters needing only connection to a power source or a light source.

Figure 2:
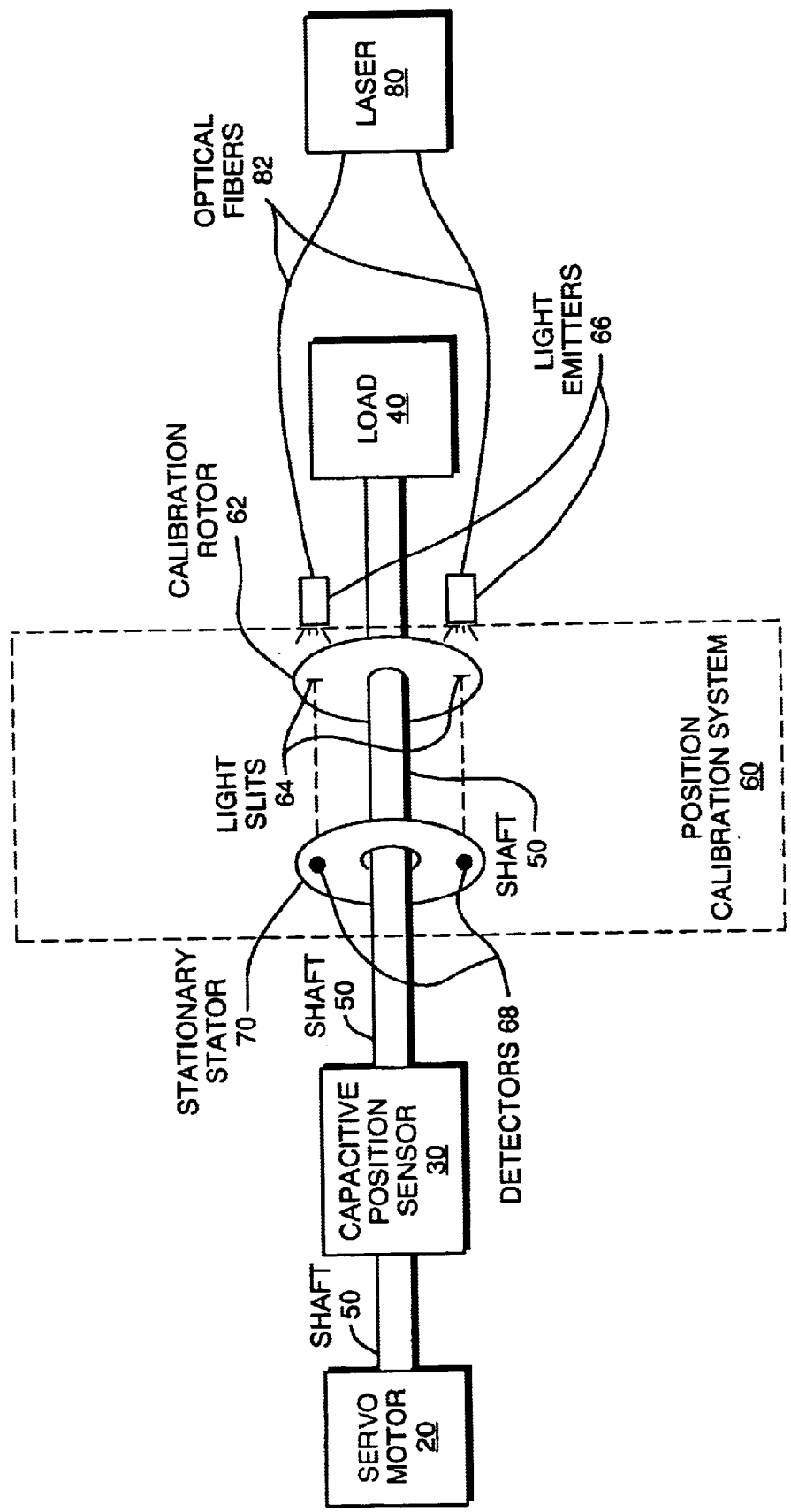
FIG. 2 is a diagrammatic view of a galvanometer with the principle components of an integral optical calibration system illustrated.

Referring now to FIG. 2, there is illustrated another, more detailed implementation of calibration system 60, this time disposed between the full range position detector 30 and load 40. As in FIG. 1, servo motor 20 is connected to shaft 50, as is the capacitive full range position sensor 30 and load 40. The optical calibration system 60 has a calibration rotor 62 with collimated light slits 64, which is rigidly attached to shaft 50 close to load 40. Calibration rotor 62 is thus rotationally very rigid with respect to load 40.

Two light emitters 66 are securely arranged in a stationary position relative to the galvanometer housing, close to one side of rotor 62. The emitters are directed towards two respective detectors 68, which are securely arranged in a stationary position on the other side of rotor 62, so as to form a first emitter/detector pair and a second emitter/detector pair between which rotor 62 rotates with load motion. When rotor 62 positions a slit 64 so as to permit optical transmission from an emitter to its respective detector, a calibration signal output from that emitter/detector pair occurs.

"In this embodiment, the two detectors 68 are mounted in a spaced apart relationship on a stationary stator 70, through which shaft 50 passes without contact. Remote laser light source 80 generates the light beam, which is transmitted via optical fibers 82 to emitters 66, which then generate uncollimated light directed towards the light detectors 68. Rotor 62 blocks this light, inhibiting a calibration signal output from detectors 68, unless rotated by shaft and load motion to a calibration reference position as explained above."

All of the elements of the calibration system 60 of this embodiment, except light source 80 are contained within the housing of galvanometer 10. Again, various other types of light emitters, bulbs, LED's and other light sources may be used as emitters 66, and be enclosed within the housing.

Light from either emitter 66 can only be detected at its respective detector 68 when rotor 62 is angularly positioned to place a slit 64 between one or the other emitter/detector pairs. There is a predetermined first angular calibration position of load 40 and rotor 62 within the position calibration signal output from the first emitter/detector pair. There is a predetermined second angular calibration position of load 40 and rotor 62, likewise within the normal range of angular motion of galvanometer 10, where the second slit 64 will permit a second position calibration signal output from the second emitter/detector pair.

It will be readily apparent that first and second angular calibration positions for the galvanometer can be predetermined by manipulation of the amount of angular separation and location of the emitter/detector pairs with respect to the angular range of motion of the rotor and the angular position and spacing of the enabling optical slits on the calibration rotor. Other embodiments may have only one emitter/ detector pair, or more than two emitter/detector pairs, and only one or more than two enabling optical collimating slits. Each emitter/detector pair can signal the presence of the load at one or more angular calibration positions, depending on the number of slits that come into alignment with that emitter/detector pair over the normal range of the galvanometer. As will be readily apparent to those skilled in the art, when more than one position is associated with the same detector, there must be included a logic means for resolving which position is indicated, such as by assuming it to be the closer reference position to the concurrently reported position.

"Yet other embodiments may use one slit to enable two different emitter/detector pairs. Other combinations are possible, too. However, for simplicity, it is preferable to have two sets of one slit related to one emitter/detector pair, so as to have each of two, single source, calibration output signals identified with a respective one of two discrete, angular calibration positions."

Figure 3:
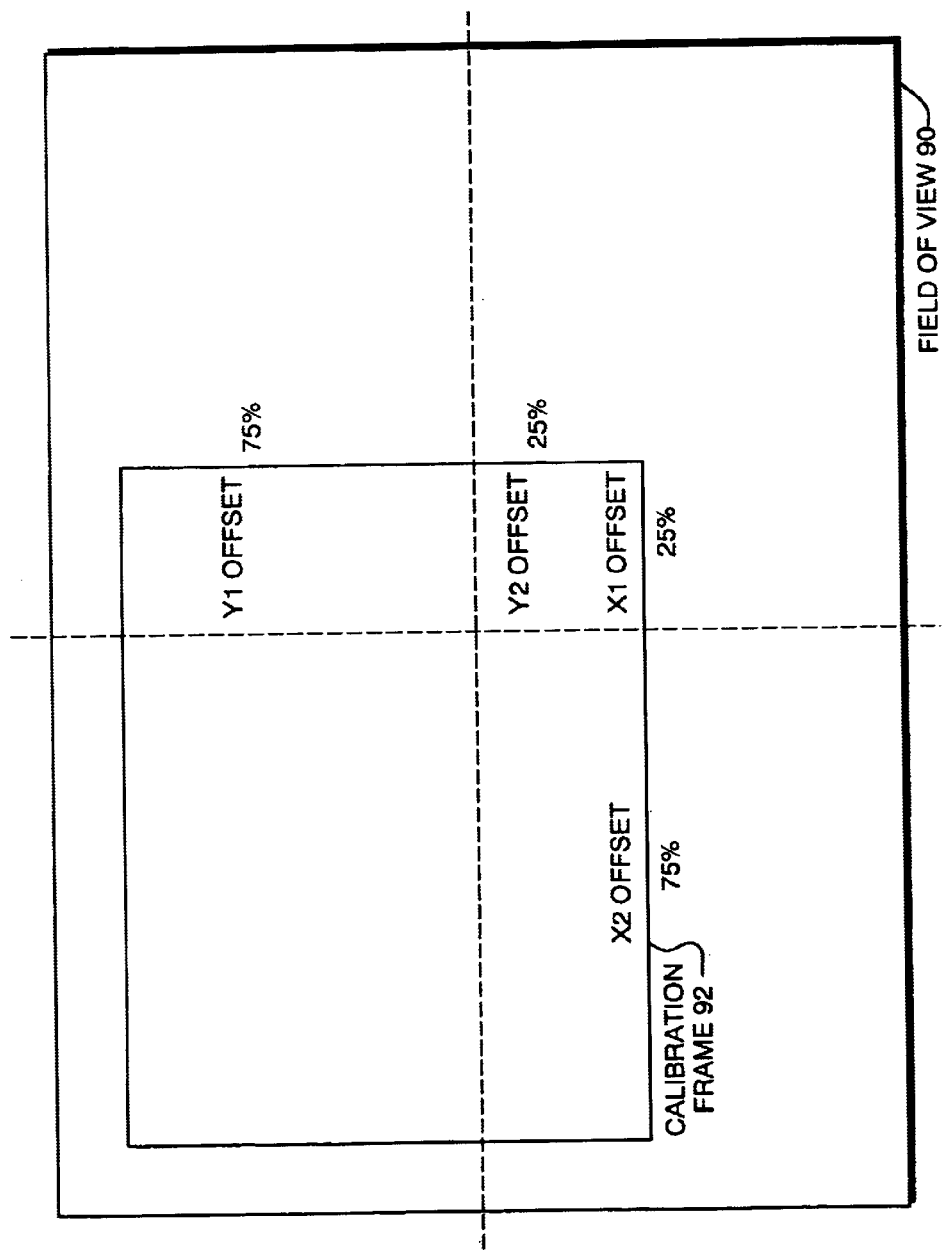
FIG. 3 is a diagrammatic representation of an offset calibration frame on a target area field of view.

Referring to FIGS. 2 and 3. the size and configuration of the slits in the rotor permits only a thin, highly collimated sheet of light to pass through to the detector, and only when the slit is precisely located between the emitter and the detector. In the embodiment of FIG. 2, the rotational spacing of the two slits 64 on rotor 62 is determined by the full range or arc of rotation of the load, and the desired relative spread and position of the angular calibration positions within that range. The load having bi-directional capability; the detector must have consistent response to slit passage from either direction.

The location on rotor 62 of the first slit 64 is calculated so as to trigger a first calibration position signal at the first detector only when the load location reaches a pre-determined amount of offset $X_1$ to one side of the center of the load arc or range of output motion. The location on rotor 62 of the second slit 64 is calculated so as to trigger a second calibration position signal at the second detector only when the load location reaches a pre-determined amount of offset $X_2$ to the other side of the center of the load arc or range of output motion. The sum of the two offsets determines the size on the X axis of the calibration frame in the output motion target area, as described above for a two axis scanner.

In a two axis device, a second galvanometer 10 oriented to provide the Y axis output motion is configured to have a pre-determined Y1 and Y2 offsets. The four X and Y offset values fully define the calibration frame 92 in field of view 90 of FIG. 3.

The structure of galvanometer 10 supporting the emitters and detectors is constructed of a low expansion stable steel alloy such as invar. Furthermore, the invar structure is insulated from the environment, and surrounded by a heating blanket. The temperature of the invar structure and its contents is maintained at a stable temperature by a temperature control servo mechanism.

As a result, the mechanical location of emitters 66 and detectors 68 are maintained over long periods of time in a sufficiently precise relationship so that the two load motion angles at which a calibration position detector signal is triggered can be considered true and constant references for this purpose; in other words, perfect. Thus the difference between these two perfect reference positions and the corresponding reported positions measured by the full range position sensor 30 represents error values in offset and gain. The error values are then added to the data values already in the calibration look-up table, to re-calibrate the full range position sensor.

The electronics necessary to the invention are not shown in FIGS. 1 and 2, but will be readily apparent to those skilled in the art. For example, every time the collimated light reaches one of the calibration position detectors 68, a snapshot is taken of the measured position of full range position sensor 30, via sample and hold electronics. The analog data is converted to digital data via an A/D converter, and the information is processed for updating the look-up table.

The calibration trigger signals from the optical calibration system 60 are used as time-based reference signals to indicate that load 40 has rotated into a triggering position which is assumed to be exactly the pre-determined fiducial position. The difference between the optical system calibration position and the capacitive full range position sensor reported position represents error. After simple processing, the necessary corrections are applied to the look-up table or the equivalent logic circuitry by which calibration data is accessed by the position sensor for generating the reported position.

Figure 4:
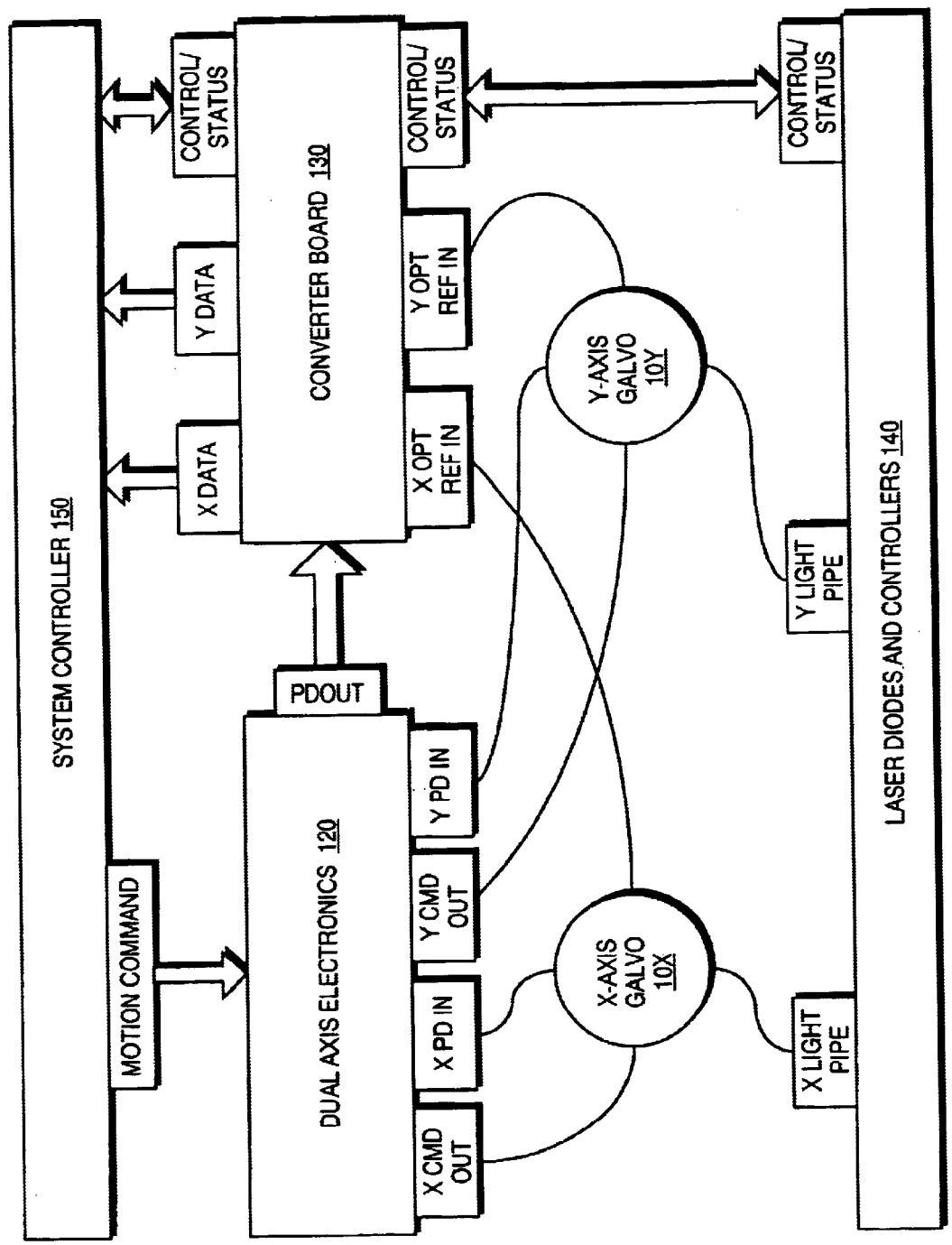
FIG. 4 is a system diagram of a two galvanometer, two axis scanning system of the invention.

"Referring to FIG. 4, there is illustrated a block diagram depicting a two axis scanner system using a dual axis electronics module 120 which outputs an analog reported position signal (PDOUT) to converter board 130, and two galvanometers 10X and 10Y configured in accordance with the embodiment of FIG. 2. Both galvanometers are interconnected to dual axis electronics module 120 by wires (X CMD OUT, X PD IN, Y CMD OUT, Y PD IN), to converter board 130 by wires (X OPT REF IN, Y OPT REF IN), and to the external laser diode and controller block 140 by optical fibers (X Light Pipe, Y Light Pipe). System controller 150 receives X axis data and Y axis data and exchanges control/status data with converter board 130, and gives position commands to dual axis electronics module 120. Laser diodes and controllers block 140 supports the two galvanometers and shares control/status data with converter board 130 as described below."

"The galvanometers 10X and 10Y work as previously described. Whenever an optical reference point is encountered in either axis, the converter board 130 captures the value of the respective position detector amplifier output (PDOUT) and evaluates the captured data against established limits (X OPT REF IN, Y OPT REF IN). The data and the results of the evaluation, for each axis in the system, are output to the system controller 150.

Within laser diodes and controllers block 140 there are present but not shown, two laser diodes for each galvanometer and two auxiliary electronics modules for each laser diode,—a current source and a temperature controller. These elements function as follows. The current source for each diode is configured to maintain a constant light intensity output from the laser diode based on feedback from a photodiode embedded in the laser diode module. A current limit setpoint is established in the current source to prevent the laser diode from being overdriven, and to protect the current source in case of catastrophic fault.

The temperature controller for each diode is configured to maintain a constant temperature at the laser diode by driving current through a thermoelectric module (TEM) attached to the case of the laser diode. The controller uses the resistance value of a thermistor embedded in the laser diode module along with the temperature setpoint and the control loop gain settings on the controller to determine the proper magnitude and direction of current flow through the TEM. A current limit setpoint is established to prevent the TEM from being overdriven, and to protect the current source in case of a catastrophic fault.

Converter board 130 provides a control port to monitor and control the temperature controller and laser diode current source for each diode, thus adding to the stability of the optical energy in the continuous calibration system. In addition, the evaluation limits established for each optical reference point of each galvanometer can be monitored and changed via this port.

The invention is susceptible of other embodiments, all within the scope of the claims that follow. For example, there is an optical calibration trigger system for a servo controlled reciprocating rotary device, consisting of an optical calibration rotor attached to a rotating element of the rotary device such as the main shaft or even the load, where the rotating element has a pre-determined full range of rotation. There is at least one light collimating slit in the rotor, at least one stationary light emitter proximate one side of the rotor, and at least one stationary light detector proximate the other side of said rotor. The detector is directed towards the light emitter. Rotation through the full range of the rotating element causes a slit to pass between a light emitter and a detector, which is equated with passage of the load through a unique, known fiducial position within the full range rotation of the rotating element because of the direct mechanical linkage. The detector is configured for emitting an optical calibration trigger signal upon detection of light.

The device may have two slits, two light emitters, two light detectors, with the device being configured for emitting a calibration trigger signal at each of two fiducial positions. The light emitters and detectors may be angularly adjustable with respect to the rotor and slits so as to permit user setup or adjustment of the location of each fiducial position. The location may be specified as a percentage of offset spacing from the center of the full range of rotation. The reciprocating rotary device being a galvanometer, and the load a mirror.

The light emitters may have a remote light source. The remote light source may have a control system with temperature and current sensors and controllers for controlling light intensity of the light source.

As another example, there is a method for maintaining calibration of a position detector for an operating servo controlled reciprocating rotary device, consisting of the following steps.

First, using a servo controlled reciprocating rotary device configured with a optical calibration trigger system similar to that described above, where the calibration rotor is rotationally locked to the rotating load such as by direct attachment to the load or to the load shaft. There is a stationary light emitter proximate one side of the rotor, and a light detector proximate the other side of the rotor and directed towards the light emitter. The calibration rotor is configured with a light collimating slit, and the detector is further configured for emitting a calibration trigger signal upon detection of light. Passage of the load through a known fiducial position within full range of rotation of the load is associated with passage of the slit between the emitter and the detector. The position detector has a full range position sensor and a calibration database where each measured position is adjusted by a calibration error for generating a reported position.

Next, during operation of the device and upon occurrence of a calibration trigger signal, comparing the known fiducial position to the concurrent reported position of the position it detector. Then generating calibration corrections from those comparisons. And then applying the calibration corrections to the calibration database.

The method may employ a device set up for using two fiducial positions, and having two sets of exclusively associated emitter, detector and rotor slit for monitoring the occurrence of the A load reaching a respective fiducial position. There may be a further step of resolving the new calibration corrections into gain and offset components, where the applying of the calibration corrections to the calibration database involves extrapolating and adding the new calibration corrections to all cells of a gain and offset calibration database lookup table, so that the some of the calibration corrections and the measured position are equal to the reference or fiducial position. Of course, the rotary device may be a galvanometer, and the load a mirror.

Another method of the invention for maintaining calibration of a partial rotation rotary device for driving a reciprocating load member includes the steps of: providing a calibration rotor locked to the reciprocating load member, where the calibration rotor has at least one collimating slit for passing an emitted light from one side of the rotor to the other; illuminating the slit from a first side of the calibration rotor: detecting collimated illumination that passes through the slit; emitting a calibration trigger signal whenever that happens; comparing the measured position of the reciprocating member as taken at the time of the occurrence of the calibration trigger signal with an assumed correct position which is based on the mechanical linkage between the load member and the optical elements; and then generating a calibration correction value set based on the compared values, which can be applied to subsequent measurements of position.

The steps of the above method can be extended to include providing a second collimating slit on the calibration rotor; detecting collimated illumination that passes through the second collimating slit; emitting a second calibration trigger whenever that happens; comparing the measured position of the reciprocating member at the time of the occurrence of the second calibration trigger signal with an assumed second correct position; and generating a second calibration correction value set based on the compared values.

Yet another example of the invention is a servo controlled reciprocating rotary device with continuous calibration consisting of a bi-directional motor, a main shaft, load, a full range angular position detector, a servo controller, and a continuous optical calibration system. The motor and load are connected to the main shaft, and the load has a full range of rotation of not more than 360 degrees, typically not more than 40 degrees. The position detector provides a reported position to the servo controller indicating the measured position of the load as corrected with calibration data. The servo controller is connected for control inputs to the motor. The optical calibration system is as described above.

Still yet another example is a two axis scanning system with a continuous optical calibration capability, consisting of a scanner light beam source, two orthogonally arranged galvanometers, a target field of view, and a system controller, where the galvanometers are equipped with either independent or linked continuous optical calibration position reference systems as described above.

A further example is a galvanometer with integral continuing calibration capability, consisting of a servo motor and drive shaft, a load attached to the drive shaft, an angular position detector circuit and a calibration look up table, a stationary light emitter, a stationary light detector directed towards the light emitter, and a rotor mounted on the shaft between the light emitter and the light detector. As previously described, the rotor has the at least one collimating light slit, and the slit is configured to rotate in between the light emitter and the detector at a pre-selected fiducial position. There is also circuitry for sampling the measured position of the load as measured by the position detector circuit and calculated from the calibration look up table at the moment the optical detector senses light, for comparing the reference position to the measured position, calculating an error correction value, and applying the error correction value to the look up table.

The present invention has been particularly shown and described with respect to certain preferred embodiments of features in the written description, figures, and claims. However, it should be readily apparent to those of ordinary skill in the art that various changes and modifications in form and details may be made without departing from the spirit and scope of the invention. Additional objects and advantages of the present invention may be further realized and attained by means of the instrumentalities and combinations all within the scope of the claims. The drawings and description are to be regarded as illustrative in nature, and not as restrictive.

What is claimed is:

1. An optical calibration trigger system for a servo controlled reciprocating rotary device, comprising:

an optical calibration rotor attached to a rotating element of said rotary device, said rotating element having a pre-determined full range of rotation, and said rotor having at least one light collimating slit;

at least one stationary light emitter proximate one side of said rotor; and at least one stationary light detector proximate the other side of said rotor and directed towards a corresponding one of said light emitters, each detector configured for emitting an optical calibration trigger signal upon detection of light received through said at least one light collimating slit, thereby indicating a load coupled to said rotating element is at a known fiducial position within said full range of rotation:

wherein upon occurrence of a said calibration trigger signal, said known fiducial position is compared to a concurrently measured position of said load, thereby generating a calibration error for adjusting a reported position.

2. An optical calibration trigger system according to claim 1, said at least one collimating slit being two slits, said at least one light emitter being two light emitters, said at least one light detector being two light detectors, said rotary device configured for emitting a calibration trigger signal at each of two fiducial positions within said full range of rotation.

3. An optical calibration trigger system according to claim 2, said light emitters and said detectors being angularly adjustable with respect to said rotor and said slits so as to permit adjusting said fiducial positions within said full range of rotation.

4. An optical calibration trigger system according to claim 3, said adjusting comprising selecting a percentage of offset spacing from the center of said full range of rotation.

5. An optical calibration trigger system according to claim 4, said reciprocating rotary device being a galvanometer, said load being a mirror.

6. An optical calibration trigger system according to claim 5, said light emitters having a remote light source.

7. An optical calibration trigger system according to claim 6, said remote light source having a control system for controlling light intensity of said light source.

8. A method for maintaining calibration of a position detector for an operating servo controlled reciprocating rotary device comprising:

using a said servo controlled reciprocating rotary device configured with a calibration rotor rotationally locked to a rotating load thereof, a stationary light emitter proximate one side of said rotor, and a light detector proximate the other side of said rotor and directed towards said light emitter, said calibration rotor configured with a light collimating slit, said detector further configured for emitting a calibration trigger signal upon detection of light, passage of said load through a known fiducial position within full range of rotation of said load being associated with passage of said slit between said emitter and said detector, said position detector having a full range position sensor and a calibration database wherein each measured position is adjusted by a calibration error for generating a reported position;

comparing during operation of said rotary device, upon occurrence of a said calibration trigger signal, said known fiducial position to a concurrently reported position of said position detector;

generating calibration corrections therefrom; and applying said calibration corrections to said calibration database.

9. A method for maintaining calibration of a position detector for an operating servo controlled reciprocating rotary device according to claim 8, said fiducial position being two fiducial positions, said collimating slit being two slits, each said slit being associated with one of said fiducial positions, said light emitter being two light emitters, each said light emitter being associated with one of said slits, said light detector being two light detectors, each said detector being associated with one of said light emitters.

10. A method for maintaining calibration of a position detector for an operating servo controlled reciprocating rotary device according to claim 8, further comprising:

resolving said calibration corrections into gain and offset components, said applying said calibration corrections to said calibration database comprising extrapolating and adding said corrections to cells of a gain and offset calibration database lookup table.

11. A method for maintaining calibration of a position detector according to claim 8, said rotary device being a galvanometer, said load being a mirror.

12. An optical calibration system comprising:

a rotor attached to a motor shaft, at least one collimating slit in said rotor, at least one stationary light emitter proximate one side of said rotor, at least one stationary light detector proximate the other side of said rotor and directed towards said light emitter, wherein rotation of a load on said shaft causes said rotor to rotate a said slit between a said light emitter and a said detector, passage of said slit between said light emitter and said light detector being equated with passage of said load through a predetermined fiducial position within a full range of rotation range associated with said load, said detector configured for emitting a calibration trigger signal upon detection of light; and circuitry for comparing upon occurrence of a said calibration trigger signal said fiducial position to a concurrently reported position of said load, and for generating additional calibration corrections therefrom, and for adding said additional calibration corrections to existing calibration corrections.

13. An optical calibration system according to claim 12, said fiducial position being two fiducial positions, said at least one detector being two detectors, each said detector associated with one of said fiducial positions, said at least one light emitter being two light emitters, each said light emitter being associated with one of said detector, said at least one collimating slit being two slits, each said slit being associated with one of said detectors, wherein a said calibration trigger signal is emitted when said load reaches either of said two fiducial positions.

14. An optical calibration system according to claim 12, said circuitry configured for resolving said calibration corrections into gain and offset components and for extrapolating and adding said gain and offset component to cells of a gain and offset calibration correction lookup table.

15. An optical calibration system according to claim 13, said fiducial locations comprising a selected percentage of offset spacing from the center of said full range.

16. An optical calibration system according to claim 12, said system being a galvanometer, said load being a mirror.

17. A two axis scanning system with two orthogonally arranged galvanometers comprising:

a position detector system for each axis, each position detector system for reporting rotation angle of a mirror during operation, and configured with an angular position sensor and calibration circuitry for generating a reported position from a sensor measurement, and a calibration correction lookup table containing gain and offset calibration data for the corresponding axis;

an optical calibration position reference system for each axis, each optical calibration position reference system configured with a calibration rotor mounted on a shaft of a corresponding galvanometer, at least one collimating slit in said rotor, at least one stationary light emitter proximate one side of said rotor, at least one stationary light detector proximate the other side of said rotor and directed towards a corresponding light emitter, each detector configured for sending a calibration trigger signal to said calibration circuitry upon detection of light;

wherein rotation through a full range of motion of said mirror on said shaft causes said rotor to rotate said slit between said light emitter and said detector, passage of said slit between said light emitter and said light detector being equated with passage of said mirror through a known fiducial position within said full range of said mirror, wherein said calibration circuitry is configured for comparing upon occurrence of said calibration trigger signal said fiducial position to said reported position of said position detector system, and for generating calibration corrections therefrom, and for applying said calibration corrections to the corresponding lookup table.

18. A two axis scanning system according to claim 17, said at least one collimating slit being two slits, said at least one light emitter being two light emitters, said at least one light detector being two light detectors, and said sending of a said calibration trigger signal to said circuitry is in response to said load passing either of two fiducial positions within said full range.

19. A galvanometer with integral continuing calibration capability, comprising:

a servo motor and drive shaft to which a load can be attached, the shaft having a range of rotation;

an angular position detector circuit and a calibration look up table;

a light emitter;

a light detector directed towards said light emitter;

a rotor mounted on said shaft between said light emitter and said light detector, said rotor having at least one collimating light slit, said slit configured to rotate between said light emitter and said detector at a preselected fiducial position within the range of rotation of said drive shaft; and circuitry for sampling a measured position of a load attached to the shaft as calculated by said angular position detector circuit and said calibration look up table at the moment said detector senses light, and for comparing a reference position to said measured position, and for calculating therefrom an error correction value, and for applying said error correction value to said look up table.

20. A two axis scanning system according to claim 19, said light slit being two light slits, said light emitter being two light emitters, said light detector being two light detectors, each said light detector associated with a respective fiducial position.

21. A method for maintaining calibration of a partial rotation rotary device for driving a reciprocating load member comprising:

providing a calibration rotor locked to the reciprocating load member, said calibration rotor including at least one collimating slit for passing an emitted light therethrough;

illuminating the slit from a first side of the calibration rotor;

detecting collimated illumination that passes through the slit;

emitting a calibration trigger signal thereupon;

comparing a measured position of said reciprocating member at the time of the occurrence of said calibration trigger signal with an assumed correct position; and generating a calibration correction value set based on the comparing to said assumed correct position.

22. The method of claim 21 further comprising:

providing a second collimating slit on the calibration rotor;

detecting collimated illumination that passes through the second collimating slit;

emitting a second calibration trigger thereupon;

comparing a measured position of said reciprocating member at the time of the occurrence of said second calibration trigger signal with an assumed second correct position; and generating a second calibration correction value set based on the comparing to said assumed second correct position.

* * * * *

UNITED STATES PATENT AND TRADEMARK OFFICE
CERTIFICATE OF CORRECTION

PATENT NO.    : 6,768,100 B1
DATED         : July 27, 2004
INVENTOR(S)   : David C. Brown It is certified that error appears in the above-identified patent and that said Letters Patent is hereby corrected as shown below:

Column 5,
Line 15, delete second occurrence of "or"

Column 8,
Line 54, between "62 within the" and "position" insert -- normal range of angular motion of galvanometer 10, where a first slit 64 will permit a first --

Column 11,
Line 64, delete "it"

Column 12,
Line 4, delete "A"

Signed and Sealed this

Nineteenth Day of July, 2005

JON W. DUDAS
*Director of the United States Patent and Trademark Office*